United States Patent
Onitsuka

(10) Patent No.: US 8,567,054 B2
(45) Date of Patent: Oct. 29, 2013

(54) ACF ATTACHMENT DEVICE AND ACF ATTACHMENT METHOD

(75) Inventor: Yasuto Onitsuka, Osaka (JP)

(73) Assignee: Panasonic Corporation, Osaka (JP)

( * ) Notice: Subject to any disclaimer, the term of this patent is extended or adjusted under 35 U.S.C. 154(b) by 1339 days.

(21) Appl. No.: 12/307,020

(22) PCT Filed: Jul. 4, 2007

(86) PCT No.: PCT/JP2007/063767
§ 371 (c)(1),
(2), (4) Date: Dec. 30, 2008

(87) PCT Pub. No.: WO2008/004702
PCT Pub. Date: Jan. 10, 2008

(65) Prior Publication Data
US 2009/0193650 A1    Aug. 6, 2009

(30) Foreign Application Priority Data
Jul. 5, 2006   (JP) .................................. 2006-185409

(51) Int. Cl.
*H01R 43/00*   (2006.01)
(52) U.S. Cl.
USPC ............................................. 29/854; 29/857
(58) Field of Classification Search
USPC .................... 29/854, 825, 857, 729, 739, 747
See application file for complete search history.

(56) References Cited

U.S. PATENT DOCUMENTS

| | | | |
|---|---|---|---|
| 6,618,937 B2 * | 9/2003 | Onitsuka ........................ | 29/832 |
| 7,021,357 B2 * | 4/2006 | Katano et al. ................. | 156/556 |
| 7,220,922 B2 * | 5/2007 | Nishino et al. ................ | 174/261 |
| 7,354,494 B2 * | 4/2008 | Miyajima et al. ............... | 156/64 |
| 7,748,113 B2 * | 7/2010 | Nakamura ....................... | 29/840 |
| 7,963,308 B2 * | 6/2011 | Muramoto et al. ........... | 156/381 |
| 8,014,890 B2 * | 9/2011 | Konrath et al. ............... | 700/121 |

(Continued)

FOREIGN PATENT DOCUMENTS

| | | |
|---|---|---|
| JP | 4-352442 | 12/1992 |
| JP | 11-261214 | 9/1999 |

(Continued)

OTHER PUBLICATIONS

International Search Report issued Nov. 14, 2007 in the International (PCT) Application of which the present application is the U.S. National Stage.

(Continued)

*Primary Examiner* — David Angwin
(74) *Attorney, Agent, or Firm* — Wenderoth, Lind & Ponack, L.L.P.

(57) ABSTRACT

An ACF attachment method includes supplying an electronic component from a component supply unit, suctioning the electronic component, simultaneously attaching a first ACF to a first terminal surface of the electronic component and a second ACF to a second terminal surface of the electronic component, and providing an ACF attachment device which includes two ACF attachment units for attaching the first ACF and the second ACF. The first terminal surface is disposed on a first edge portion of the electronic component and the second terminal surface is disposed on a second edge portion of the electronic component. The two ACF units are positioned according to a space between the first terminal surface and the second terminal surface of the electronic component, and attaching the first and second ACFs is performed using the two ACF attachment units.

4 Claims, 12 Drawing Sheets

(56) References Cited

U.S. PATENT DOCUMENTS

| | | | |
|---|---|---|---|
| 8,268,113 B2* | 9/2012 | Muramoto et al. | 156/285 |
| 2002/0004980 A1* | 1/2002 | Onitsuka | 29/832 |
| 2003/0145459 A1* | 8/2003 | Yamamoto et al. | 29/830 |
| 2004/0092137 A1* | 5/2004 | Sakaki | 439/65 |
| 2004/0129364 A1* | 7/2004 | Onitsuka | 156/64 |
| 2009/0193650 A1* | 8/2009 | Onitsuka | 29/739 |
| 2010/0260885 A1* | 10/2010 | Takahashi et al. | 425/405.2 |

FOREIGN PATENT DOCUMENTS

| | | | |
|---|---|---|---|
| JP | 2001-358177 | | 12/2001 |
| JP | 2003-59975 | | 2/2003 |
| JP | 2003-078239 | | 3/2003 |
| JP | 2003-198197 | | 7/2003 |
| JP | 2004186387 | * | 2/2004 |
| JP | 2004-186387 | | 7/2004 |
| KR | 2002-0016172 | | 3/2002 |

OTHER PUBLICATIONS

Written Opinion of the International Searching Authority (in English language) issued Nov. 14, 2007 in International Application No. PCT/JP2007/063767.

Full Machine English translation of JP 2003-78239.

* cited by examiner

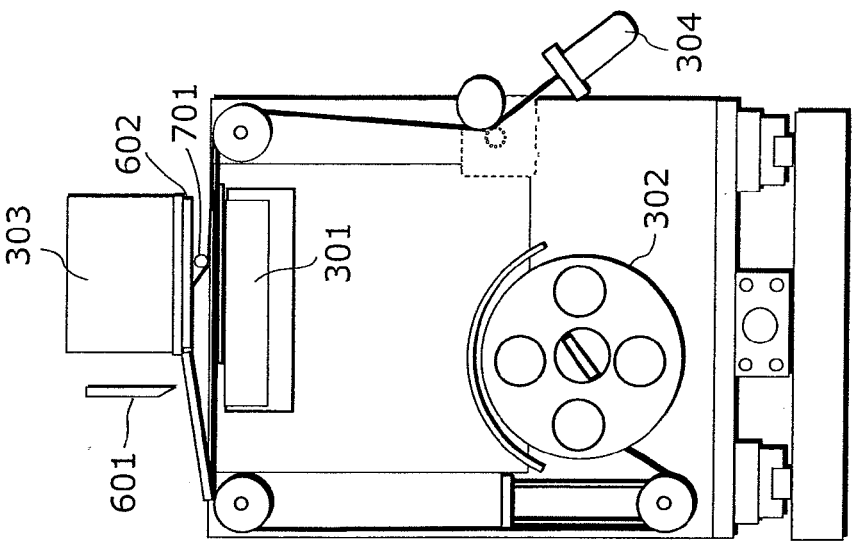
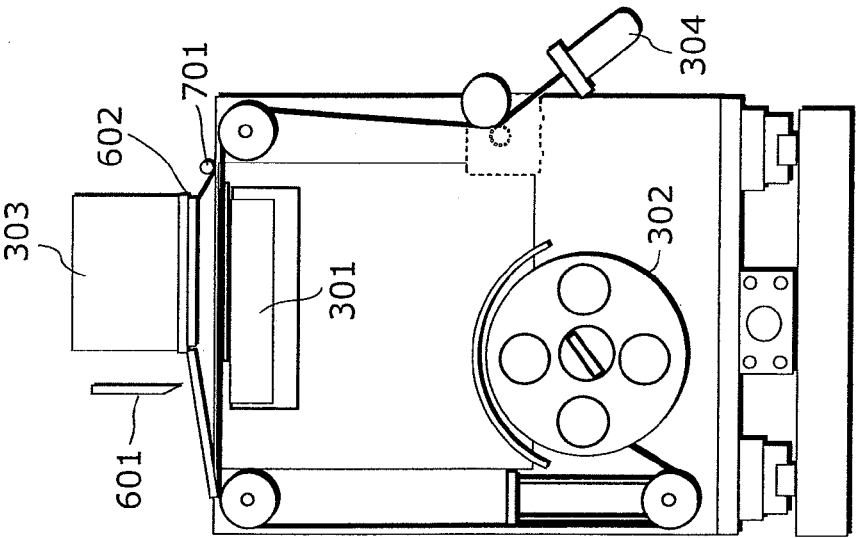
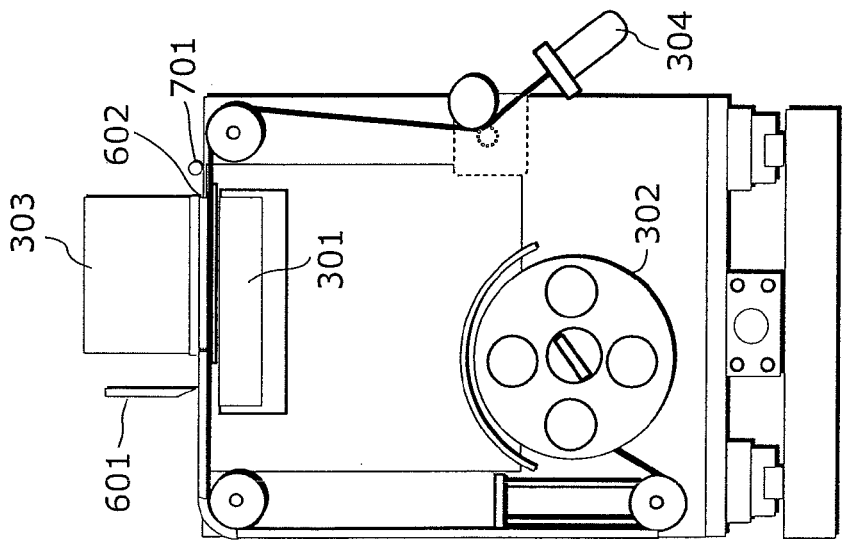

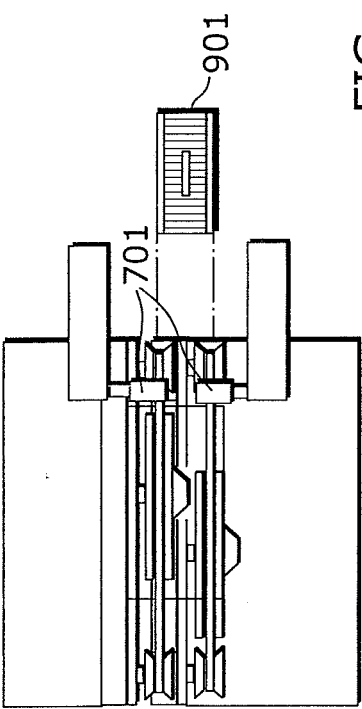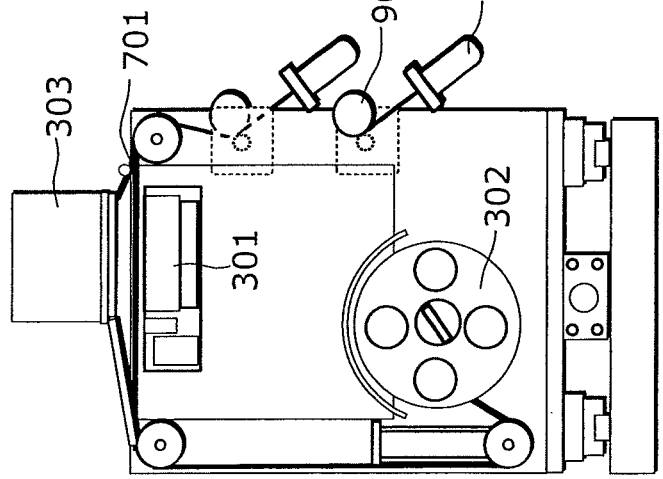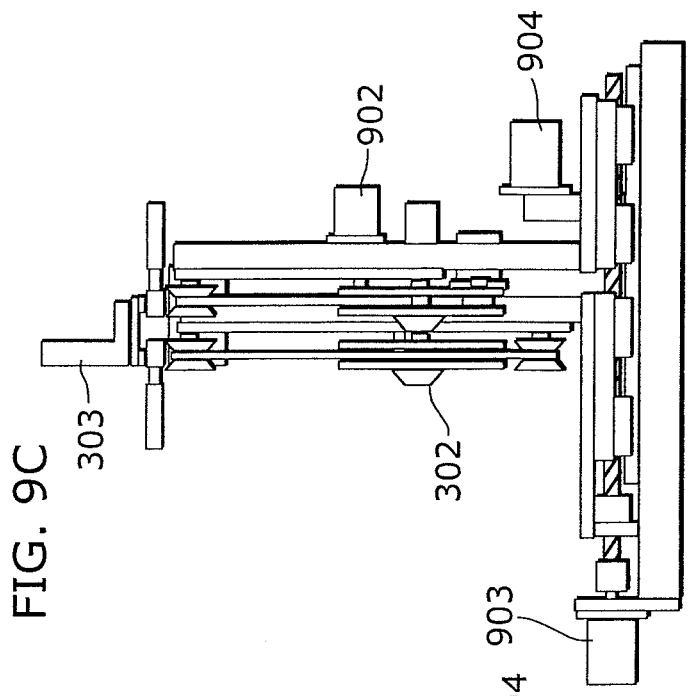

ACF ATTACHMENT DEVICE AND ACF ATTACHMENT METHOD

TECHNICAL FIELD

The present invention relates to an ACF attachment device that attaches an anisotropic conductive film tape (ACF tape) to an electronic component mounted to a board such as a liquid crystal panel, and more particularly to an ACF attachment device used in a preliminary press bonding stage of a component mounting device.

BACKGROUND ART

Conventionally, a liquid crystal driver mounting method for mounting an electronic component to a board such as a liquid crystal panel via an anisotropic conductor has been available.

FIG. 12 is a reference drawing that shows stages of a conventional liquid crystal driver mounting method. The liquid crystal driver mounting stages include an ACF attachment stage in which a liquid crystal mounting device bonds a semiconductor component to an edge portion of a liquid crystal panel, a preliminary press bonding stage of aligning an electronic component such as a TCP with an electrode unit formed in the liquid crystal panel and temporarily pressure bonding the electrode unit, a full pressure bonding stage of fully pressure bonding the electronic component to the liquid crystal panel with higher pressure, and a PCB pressure bonding stage of pressure bonding a PCB to the other electrode side of the electronic component.

Also, for example, an outer lead bonding device is disclosed in which a series of operations of bonding a tape component including a semiconductor component to a liquid crystal panel and the like via an anisotropic conductor are fully automated (for example, see Japanese Unexamined Patent Application Publication No. 4-352442).

Further, as a method of attaching an ACF to an electronic component, an electronic component mounting device is disclosed including a plurality of mounting heads that hold and mount chips to a board, the mounting heads setting a pickup station that picks up the chips, and an attachment station for attaching an anisotropic conductor set in the pickup station (for example, see Japanese Unexamined Patent Application Publication No. 11-261214).

DISCLOSURE OF INVENTION

However, for example, in the conventional liquid crystal driver mounting stages in FIG. 12, the ACF attachment stage of previously attaching the ACF that connects the electronic component and the electrode of the board needs to be provided before the preliminary press bonding stage and in two positions before the PCB attachment stage. This requires a device intended for ACF attachment, increases the size of the entire liquid crystal driver mounting device, and increases mounting tact time due to the provision of the ACF attachment stages.

In the conventional ACF attachment stage, ACFs are collectively attached to side surfaces on which the electronic component is mounted on a source side and a gate side of a liquid crystal board, and thus the ACFs are used in an area in which the ACFs would not actually be used, thereby requiring enormous costs for unnecessarily used ACFs.

The present invention is achieved in view of the above described problems, and has an object to provide an ACF attachment device that has a further reduced size and can reduce mounting tact time and costs in a liquid crystal driver mounting stage.

In consideration of the object above, the ACF attachment device according to the present invention is an anisotropic conductive film attachment device that attaches ACFs supplied from a component supply unit to an electronic component, including: a suction unit which suctions the electronic component supplied from the component supply unit; and an ACF attachment unit which simultaneously attaches the ACFs to two opposite terminal surfaces formed on an edge portion of the electronic component suctioned by the suction unit.

Furthermore, the ACF attachment device further includes: an ACF supply unit which supplies the ACFs to the ACF attachment unit; a separator collection unit which collects separators after attachment of the ACFs to the electronic component in the ACF attachment unit; and an ACF length measurement unit which measures the lengths of the ACFs supplied to the ACF attachment unit, wherein the ACF supply units, the separator collection units, and the ACF length measurement units are placed in two places according to a space between the terminal surfaces of the electronic component.

Furthermore, the ACF attachment device further includes a cutting unit provided immediately before the ACF attachment unit and which cuts the ACFs bonded to the separators from above according to the lengths of the terminal surfaces formed on the edge portion of the electronic component, wherein the suction unit suctions the electronic component from the side that is not the terminal surface, and the ACF attachment unit lowers said suction unit with predetermined pressure, thereby attaching the upward facing ACFs supplied to the opposite terminal surfaces formed on the edge portion of the electronic component after the ACFs are cut by said cutting unit.

In order to achieve the above described object, the present invention may be configured as an ACF attachment method including characteristic stages of configuring the ACF attachment device, a preliminary press bonding device including the ACF attachment device, a program that allows a computer to execute the stages of the ACF attachment method, or a liquid crystal driver mounting device including the preliminary press bonding device.

In the ACF attachment device according to the present invention, ACFs can be simultaneously attached to two sides on a board side and a panel side of an electronic component such as a TCP or a COF immediately before a preliminary press bonding stage, and thus attachment of the ACFs to the electronic component can be completed in one stage. Also, an ACF attachment stage provided in a conventional liquid crystal driver mounting device can be omitted, thereby reducing the size of the device and improving mounting tact time.

In the ACF attachment device according to the present invention, the ACFs are individually attached to the edge portion of the electronic component, and thus, compared with collective attachment used in the conventional ACF attachment device, the amount of use of the ACFs can be reduced to reduce costs without reducing productivity.

Further Information about Technical Background to this Application

The disclosure of Japanese Patent Application No. 2006-185409 filed on Jul. 5, 2006 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 7A illustrates an operation procedure of a peeling roller used in the ACF attachment device according to the present invention;

FIG. 7B illustrates an operation procedure of a peeling roller used in the ACF attachment device according to the present invention;

FIG. 7C illustrates an operation procedure of a peeling roller used in the ACF attachment device according to the present invention;

FIG. 9A is a top view of the ACF attachment device according to the present invention;

FIG. 9B is a front view of the ACF attachment device according to the present invention;

FIG. 9C is a side view of the ACF attachment device according to the present invention;

Figure 1:
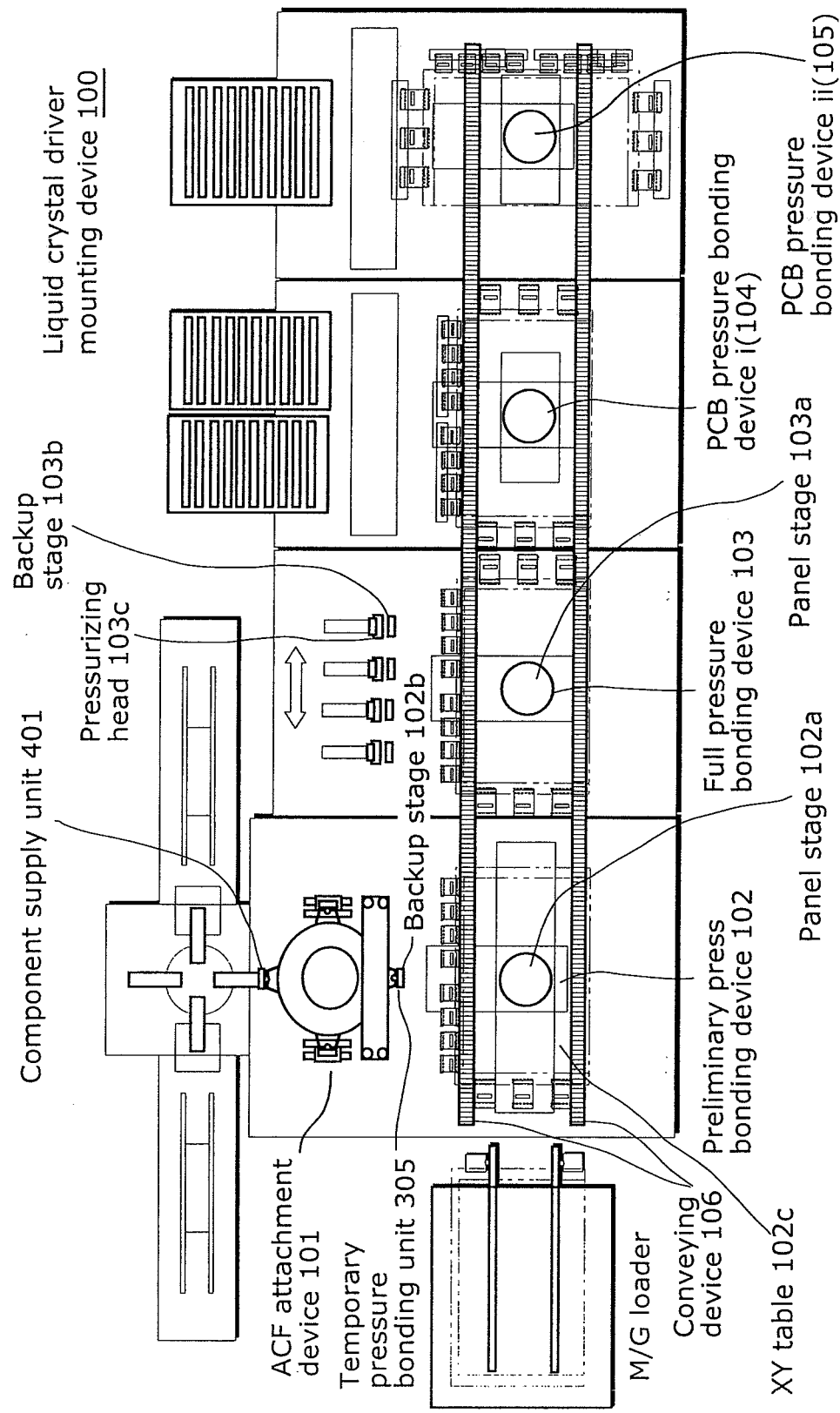
FIG. 1 is an overall view of a liquid crystal driver mounting device according to the embodiments.

DESCRIPTION OF SYMBOLS 100 liquid crystal driver mounting device
101 ACF attachment device
102 preliminary press bonding device
103 full pressure bonding device
104 PCB pressure bonding device I
105 PCB pressure bonding device II
301 ACF attachment unit
302 ACF supply unit
303 nozzle
304 separator collection unit
305 preliminary press bonding unit
306 liquid crystal panel
401 component supply unit
601 ACF cutter
701 peeling roller 902 ACF tape length measurement unit
1001 ACF attachment discrimination sensor

BEST MODE FOR CARRYING OUT THE INVENTION

Now, an ACF attachment device according to the present invention will be described with reference to the drawings.

Embodiment

FIG. 1 is an overall view of a liquid crystal driver mounting device according to the embodiment.

The shown line type liquid crystal driver mounting device includes: a preliminary press bonding device 102 including an electronic component supply unit 401 that supplies an electronic component such as a TCP, an ACF attachment device 101 that attaches an anisotropic conductive film tape (ACF tape) to the electronic component, and a preliminary press bonding unit 305 that positions one end of the electronic component on the liquid crystal panel and temporarily pressure bonds the electronic component to the liquid crystal panel; a full pressure bonding device 103 that fully pressure bonds the electronic component to the liquid crystal panel, and PCB pressure bonding devices 104 and 105 that pressure bond the other end of the electronic component pressure bonded to the liquid crystal panel to a PCB.

The preliminary press bonding device 102 includes the component supply unit 401 that supplies an electronic component to be mounted to an edge portion of the liquid crystal panel via a tray or a TCP tape (by cropping from the tape with a die).

The preliminary press bonding device 102 has four index heads placed around a rotating shaft at 90 degrees intervals. The component supplied to the component supply unit 401 is suctioned by a nozzle mounted to each index head, and then the index head is rotated by 90 degrees to convey the electronic component suctioned by the nozzle from the component supply unit 401 to the ACF attachment device 101.

When the electronic component is conveyed from the component supply unit 401 to the ACF attachment device 101, ACF tapes are simultaneously attached to terminal surfaces formed on an edge portion of the electronic component, that is, both a panel side terminal surface and a PCB side terminal surface by an ACF attachment unit described later.

Then, the nozzle is rotated by 90 degrees by the rotating shaft to convey the electronic component with the ACFs attached to the two sides from the ACF attachment device 101 to the preliminary press bonding unit 305.

Figure 3:
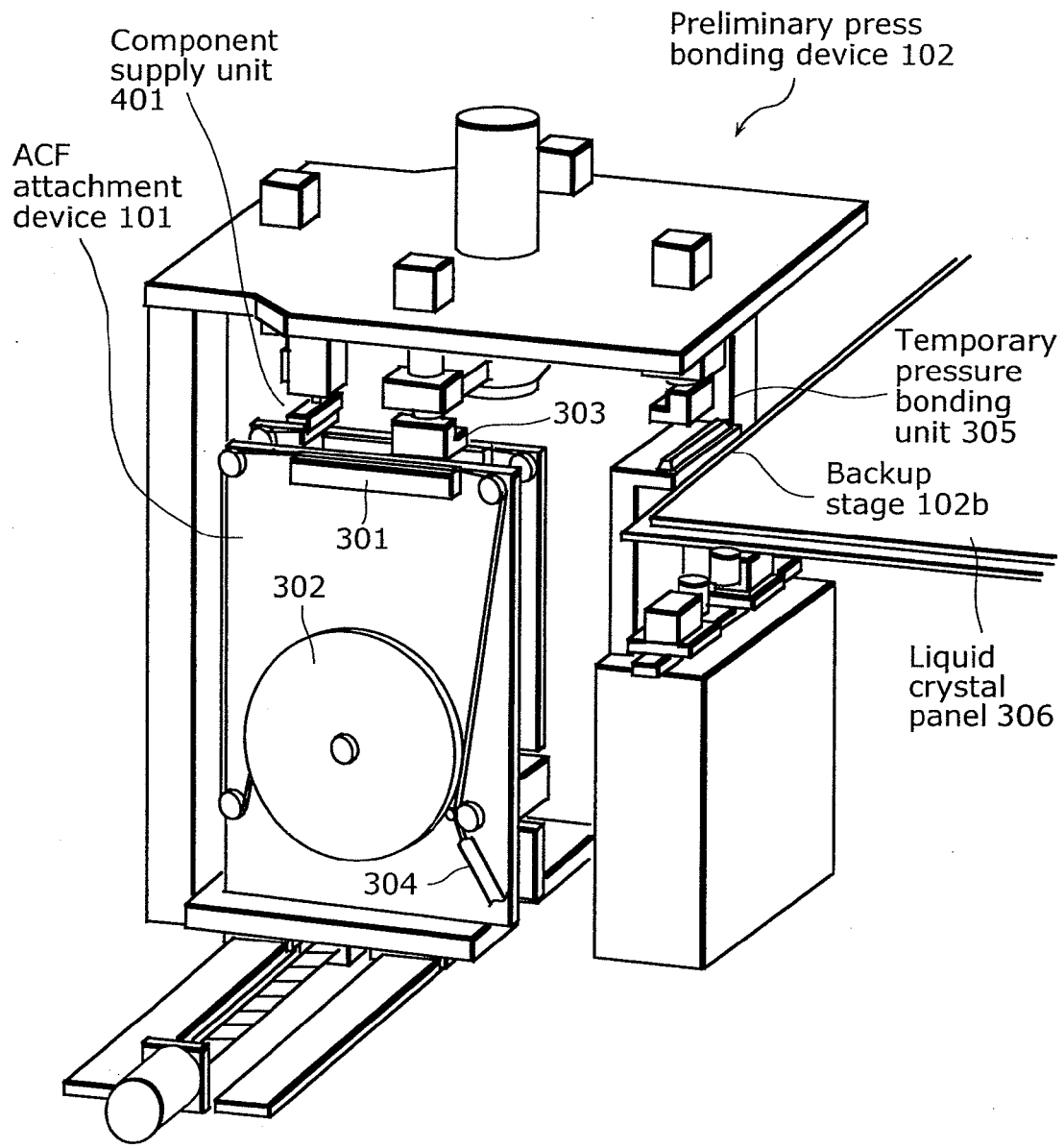
FIG. 3 is a perspective view of a preliminary press bonding device according to the present invention.

On the other hand, the preliminary press bonding device 102 includes a panel stage 102a, a backup stage 102b, an XY table 102c, or the like. Note that, the panel stage 102a suctions with the vacuum, holds, rotates, conveys and positions the liquid crystal panel supplied from a loader via a conveying device 106, and the XY table 102c positions the liquid crystal panel so that the edge portion of the liquid crystal panel is placed on the backup stage 102b or a warp correction unit. Then, as shown in FIG. 3, on the backup stage 102b provided in the preliminary press bonding unit 305, a preliminary press bonding processing is performed for aligning the electronic component conveyed from the ACF attachment device 101 by the suction head 303 with the edge portion of the liquid crystal panel 306, and then mounting the electronic component on an electrode formed in the liquid crystal panel 306.

Next, as shown in FIG. 1, the liquid crystal panel is conveyed by the conveying device 106 and transferred to a panel stage 103a in the full pressure bonding device 103, and then a full pressure bonding stage of fully pressure bonding the electronic component to the liquid crystal panel is performed. The full pressure bonding device 103 includes the panel stage 103*a*, a backup stage 103*b*, a pressurizing head 103*c*, or the like.

In the full pressure bonding device 103, the panel stage 103*a* suctions the received liquid crystal panel with the vacuum and rotates and moves the liquid crystal panel in a predetermined direction, and thus conveys and positions the liquid crystal panel on the backup stage 103*b*. Then, the temporarily pressure bonded electronic component is heated and pressurized by the pressurizing head 103*c* in order to fully pressure bond the electronic component on the backup stage 103*b*, and joined to the edge portion of the liquid crystal panel. In the full pressure bonding stage, a collective pressurization type device including a pressurizing head unit that collectively pressurizes electronic components, or an individual pressurization type device including a pressurizing head that individually pressurizes electronic components is used.

Next, the liquid crystal panel is conveyed to a PCB pressure bonding device I (104), and a PCB that constitutes a secondary board and the liquid crystal panel to which the electronic component has been temporarily pressure bonded and that constitutes a primary board are connected via the electronic component. Note that, in the present invention, the ACF attachment device 101 is provided in the preliminary press bonding device 102, and thus the ACF has been attached to a PCB side terminal surface of the electronic component in the PCB pressure bonding device I (104), thereby allowing an ACF attachment stage as in a conventional device to be omitted.

In FIG. 1, the PCB pressure bonding device I (104) is responsible for a stage of pressure bonding the PCB to a source side of the liquid crystal panel, and a PCB pressure bonding device II (105) is responsible for a stage of pressure bonding the PCB to a gate side of the liquid crystal panel.

Figure 2:
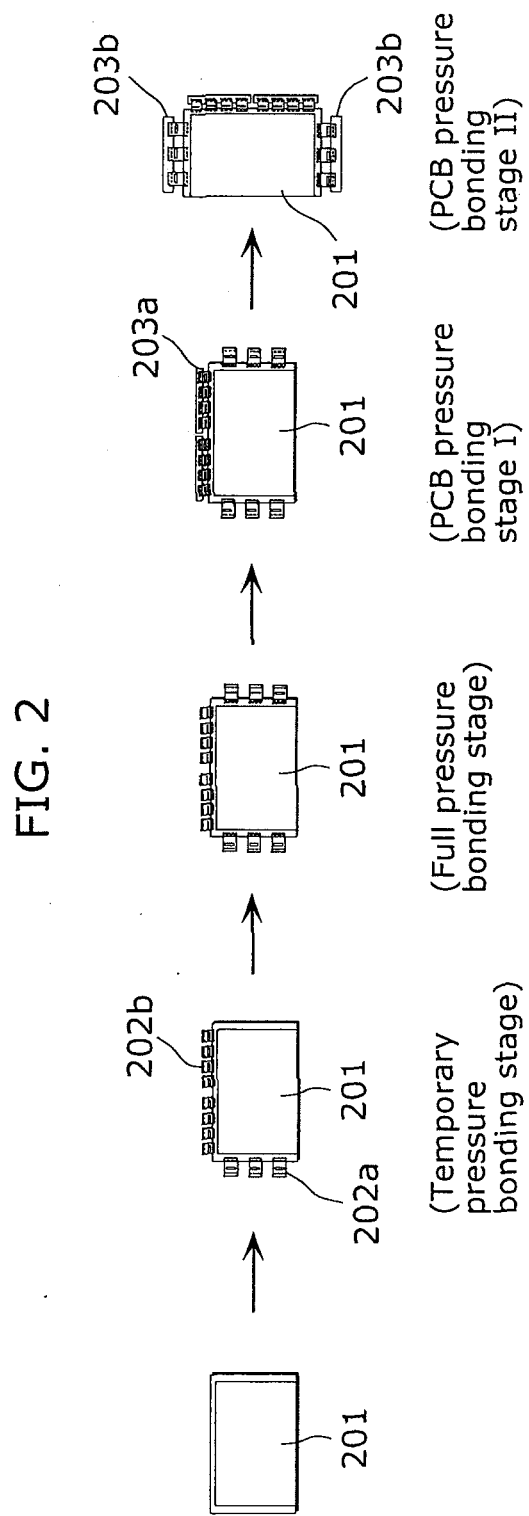
FIG. 2 illustrates an electronic component pressure bonded to a liquid crystal panel in each stages of the liquid crystal driver mounting device.

FIG. 2 illustrates the electronic component pressure bonded to the liquid crystal panel in the stages of the liquid crystal driver mounting device including the preliminary press bonding device according to the present invention.

In the preliminary press bonding stage, one of electronic components 202*a* and 202*b*, which have ACFs attached to terminal surfaces opposite to the electronic components in an ACF attachment device, are temporarily pressure bonded to an edge portion of a liquid crystal panel 201 supplied to the liquid crystal driver mounting device.

Then, the liquid crystal panel with the electronic components 202*a* and 202*b* is conveyed to the full pressure bonding stage and the electronic components 202*a* and 202*b* are fully pressure bonded to the liquid crystal panel 201. Then, the liquid crystal panel with the electronic components 202*a* and 202*b* is conveyed to the PCB pressure bonding stage I, and PCBs 203*a* and 203*b* are pressure bonded as secondary boards to sides opposite the sides to which the ACFs have been attached in the ACF attachment device in the preliminary press bonding stage and that are temporarily pressure bonded to the liquid crystal panel 201 in the preliminary press bonding stage. Note that, in the PCB pressure bonding stage I, the PCB 203*a* is pressure bonded to the source side of the liquid crystal panel 201 via the electronic component, and in the PCB pressure bonding stage II, the PCB 203*b* is pressure bonded to the gate side of the liquid crystal panel 201 via the electronic component.

Figure 5:
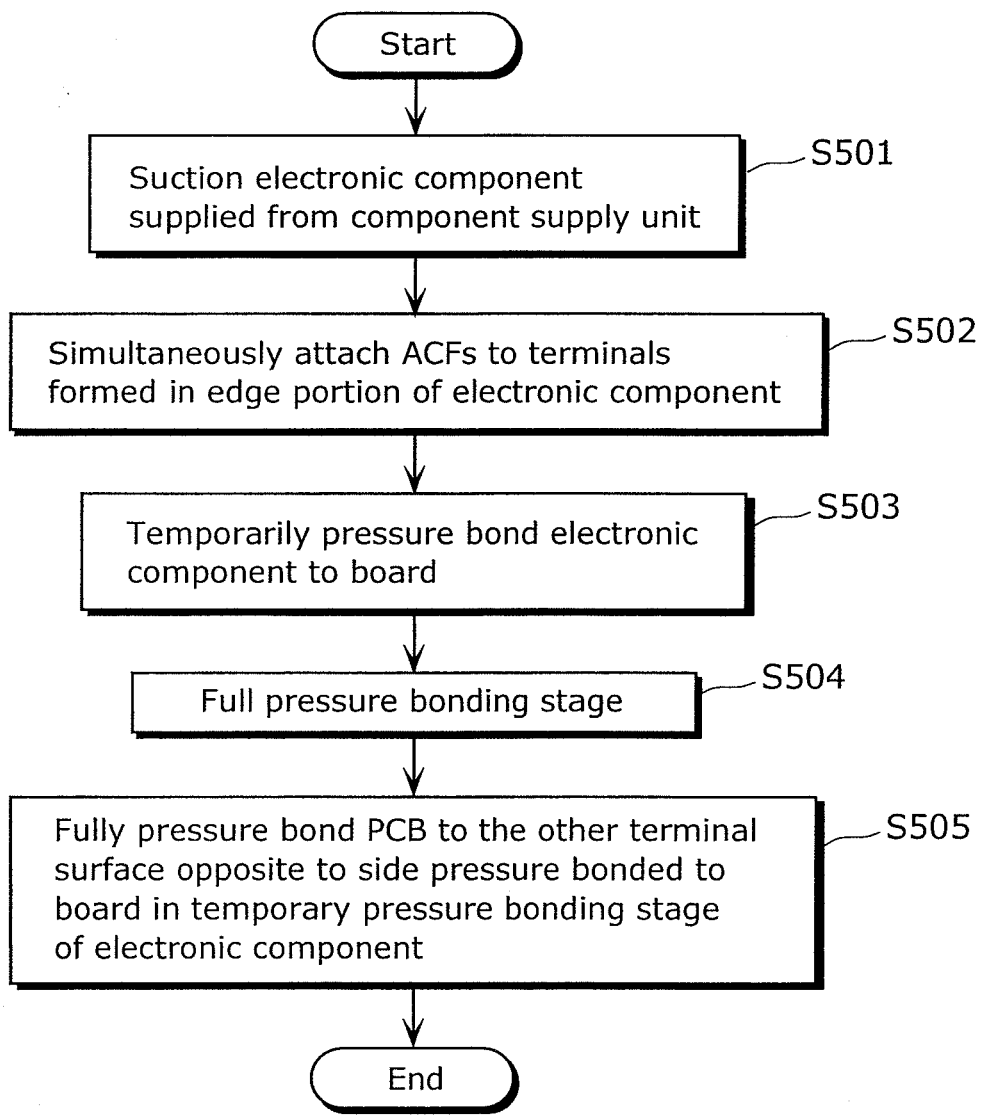
FIG. 5 is a flowchart showing an operation procedure of the liquid crystal driver mounting device which includes an ACF attachment device according to the present invention.

FIG. 5 is a flowchart showing an operation procedure of the liquid crystal driver mounting device including the ACF attachment device according to the present invention.

First, the electronic component supplied from the component supply unit is suctioned from the back surface by the nozzle (S501).

Then, the rotating shaft of the index head is rotated by 90 degrees to convey the electronic component suctioned by the nozzle from the component supply unit to the ACF attachment device, and the ACFs are simultaneously attached to the terminal surfaces formed on the edge portion of the electronic component (S502).

Next, the rotating shaft of the index head is rotated by 90 degrees to convey the electronic component suctioned by the nozzle from the ACF attachment device to the preliminary press bonding unit, and in the preliminary press bonding unit, the electronic component having the ACFs attached to the two sides in the ACF attachment device are positioned on an electrode unit on the source side or the gate side of the liquid crystal panel and temporarily pressure bonded (S503).

Then, in the full pressure bonding device, full pressure bonding that is pressure bonding with higher pressure is performed so that the temporarily pressure bonded electronic component and the electrode of the liquid crystal panel conduct (S504). Next, in the PCB pressure bonding device, the PCB as the secondary board is pressure bonded to the edge portion of the electronic component to which the ACF is attached in the ACF attachment stage in S501 (S505).

FIG. 3 is a perspective view of essential portions of the preliminary press bonding device 102 according to the present invention. As shown in FIG. 3, the preliminary press bonding device 102 according to the present invention is characterized by including the ACF attachment device 101 between the component supply unit 401 and the preliminary press bonding unit 305.

Figure 11:
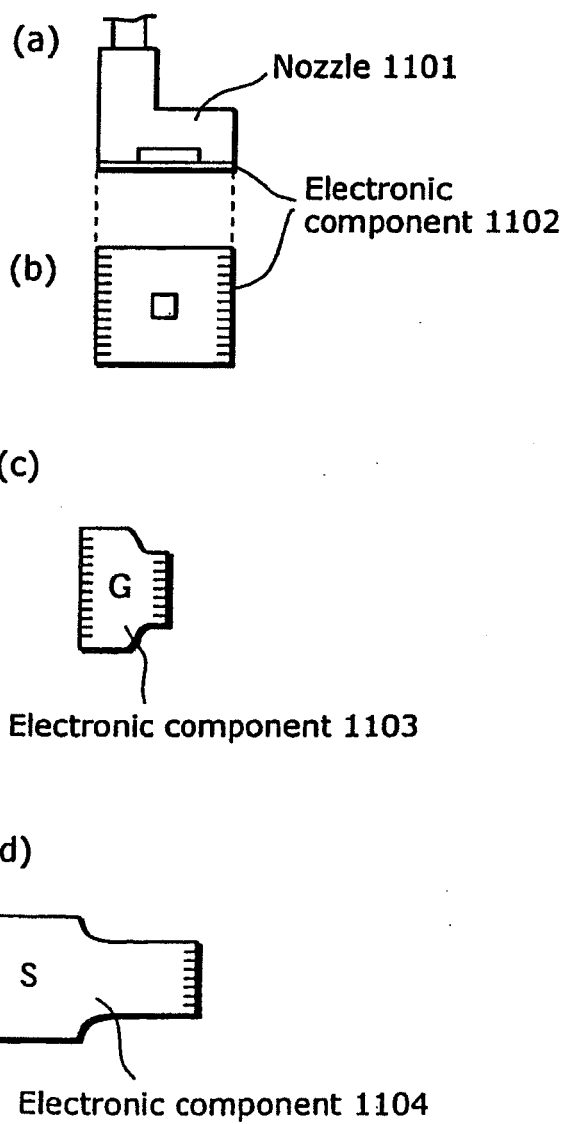
FIG. 11 illustrates a nozzle used in the ACF attachment device of the present invention.
Figure 12:
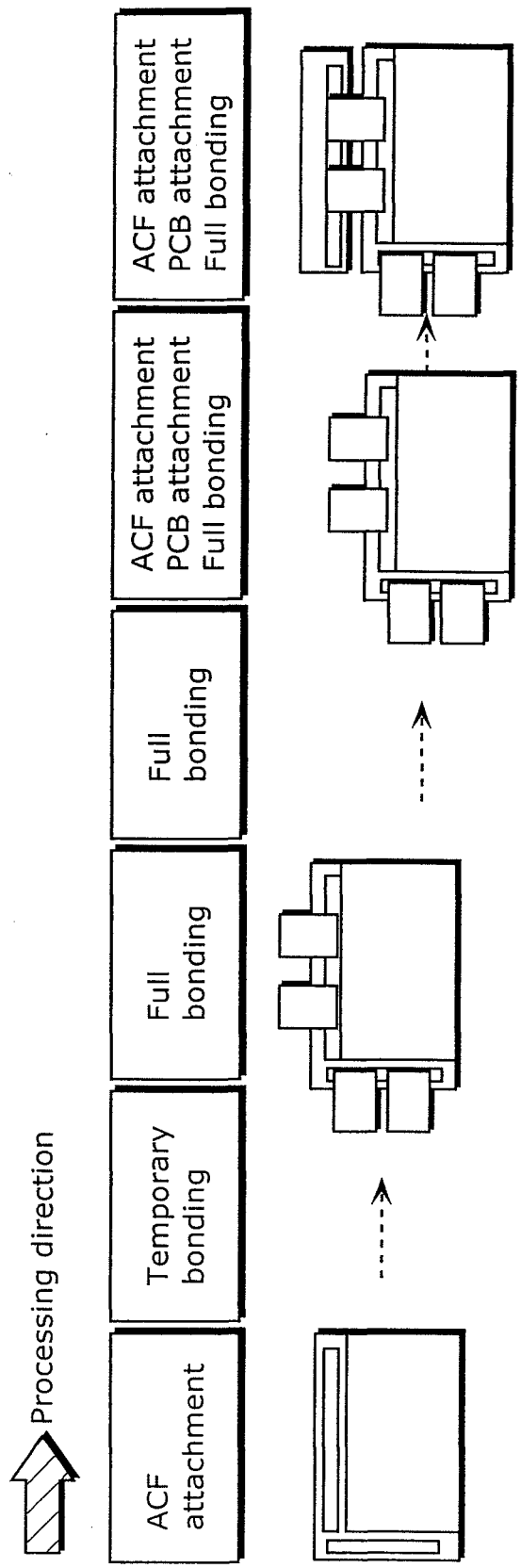
FIG. 12 is a reference drawing which shows stages of a conventional liquid crystal driver mounting method.

FIG. 11 shows a nozzle 1101 used in the ACF attachment device 101 of the present invention.

As shown in FIGS. 11A and 11B, the nozzle 1101 used in the ACF attachment device 101 of the present invention has two suctioning portions according to the shape or length of an electronic component 1102 to be suctioned, and suction (backs up) two sides on the panel side and the PCB side from the back surface. With such a nozzle 1101, the opposite terminal surfaces formed on the edge portion of the electronic component can be reliably suctioned and secured from the back surface by the suction portions formed in the nozzle 1101, and the ACFs can be simultaneously attached to the two sides of the electronic component in the ACF attachment unit.

FIGS. 11C and 11D show examples of electronic components 1103 and 1104 used on the source side and the gate side, respectively, of the liquid crystal panel. ACF preliminary press bonding processing must be performed using a nozzle having a size appropriate for each of the electronic components with different types.

As shown in FIG. 3, the ACF attachment device 101 includes an ACF attachment unit 301 that simultaneously attaches the ACFs to the two sides on the panel side terminal surface and the PCB side terminal surface of the electronic component supplied from the component supply unit 401 by a nozzle 303, an ACF tape supply unit 302 that supplies an ACF tape, the nozzle 303 that suctions and holds the electronic component, a separator collection unit 304 that collects a separator peeled from the ACF, or the like.

Note that, as described above, in the present embodiment, the four index heads are provided at intervals with equal circumferences and rotated around the rotating shaft to temporarily pressure bond the electronic component to the liquid crystal panel, and the ACF attachment device 101 that attaches the ACF to the electronic component is provided in a position 90 degrees before the preliminary press bonding unit 305.

Figure 4:
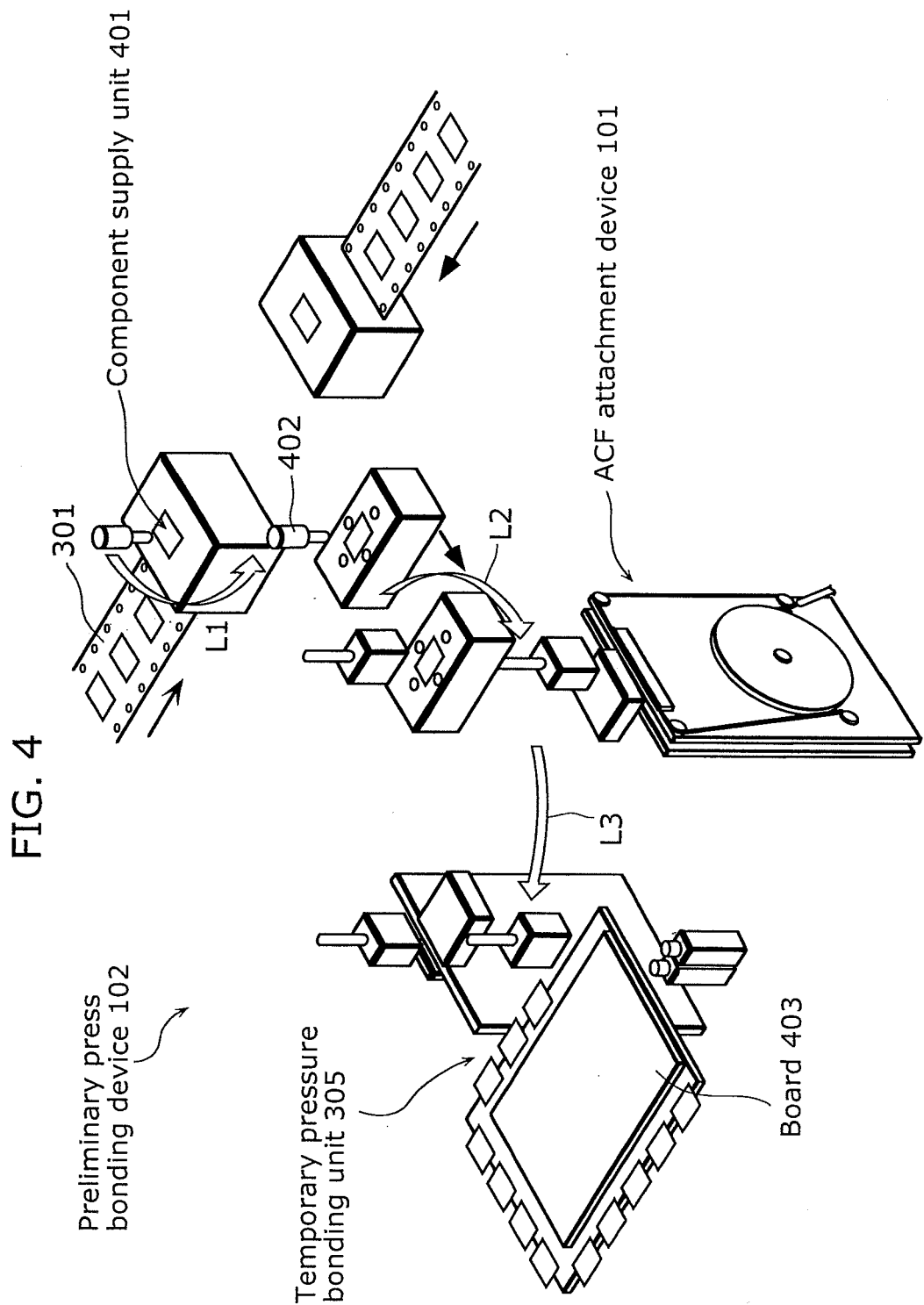
FIG. 4 illustrates an operation of the preliminary press bonding device according to the present invention.

FIG. 4 illustrates an operation of the preliminary press bonding device 102 according to the present invention.

The electronic component taken out of the component supply unit 401 is transferred to the ACF attachment device 101 through paths L1 and L2 by a take-out head 402, and the ACFs are simultaneously attached to the two sides of the edge portion of the electronic component. Then, the electronic component is conveyed to the preliminary press bonding unit 305 through a path L3, and temporarily pressure bonded onto an electrode formed on an edge portion of a board 403.

Further, as shown in the present embodiment, in the construction in which the preliminary press bonding is performed using the nozzles mounted to the four index heads, the series of operations are shared between the source side and the gate side. For example, when the component is supplied from a left reel for counterclockwise indexing, the electronic component can be temporarily pressure bonded to the source side of the liquid crystal panel, and when the component is supplied from a right reel for clockwise indexing, the electronic component can be temporarily pressure bonded to the gate side of the liquid crystal panel.

In this case, it is supposed that a nozzle corresponding to the component pressure bonded to the source side and a nozzle corresponding to the component pressure bonded to the gate side are placed in two opposite positions or two adjacent positions of the index heads according to conditions such as the type or the number of the electronic components to be pressure bonded to the panel.

FIG. 9 is a top view, a front view and a side view of the ACF attachment device according to the present invention.

FIG. 9A is a top view of the ACF attachment device. The ACFs are simultaneously attached to the terminal surfaces formed on the edge portion of the electronic component such as a TCP 901 stamped by a die, and the ACF can be peeled from a separator by a peeling roller 701.

FIG. 9B is a side view of the ACF attachment device including the ACF attachment unit 301, the ACF tape supply unit 302, the nozzle 303 that suctions the electronic component, the separator collection unit 304 for collecting used separators, an ACF length measurement unit 902 for measuring the length of the used ACF, or the like.

Note that, in the ACF length measurement unit 902, the length of the ACF used for each electronic component is measured to allow an ACF to be attached to the next electronic component to be supplied to the ACF attachment unit 301.

FIG. 9C is a front view of the ACF attachment device including two ACF tape supply units 302 according to the width of the electronic component. A space between the two ACF tape supply units 302 is adjusted according to the size of the electronic component such as the TCP by motors 903 and 904 to achieve simultaneous attachment the ACFs to two sides according to the type of each electronic component.

FIGS. 6 and 7 illustrate an ACF attachment procedure in the ACF attachment device according to the present invention.

Figure 6A:
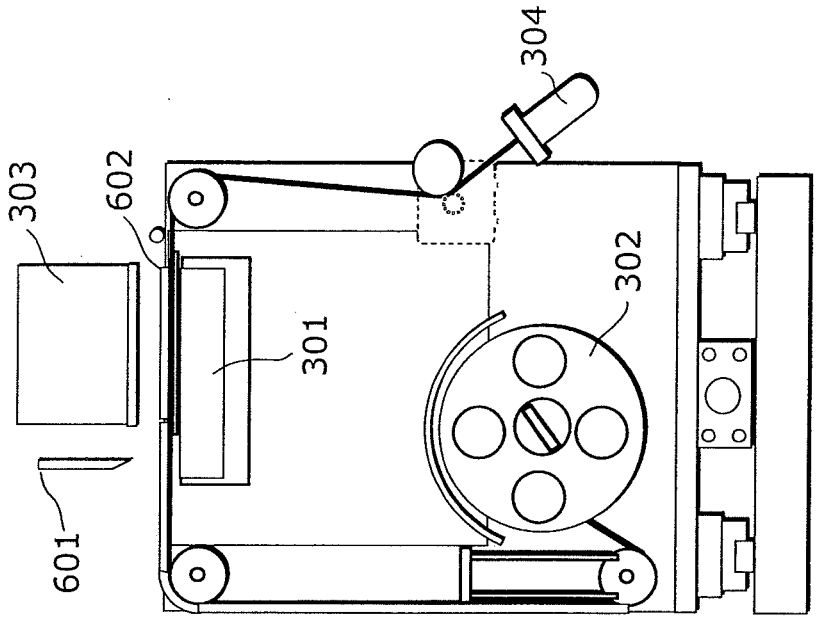
FIG. 6A illustrates an operation procedure of an ACF cutter included in the ACF attachment device according to the present invention.

As shown in FIG. 6A, the ACF placed in the ACF tape supply unit 302 is fed by a predetermined length by an unshown feeding unit, and cut from upward by an ACF cutter 601 before the ACF attachment unit 301, leaving the separator.

Figure 6B:
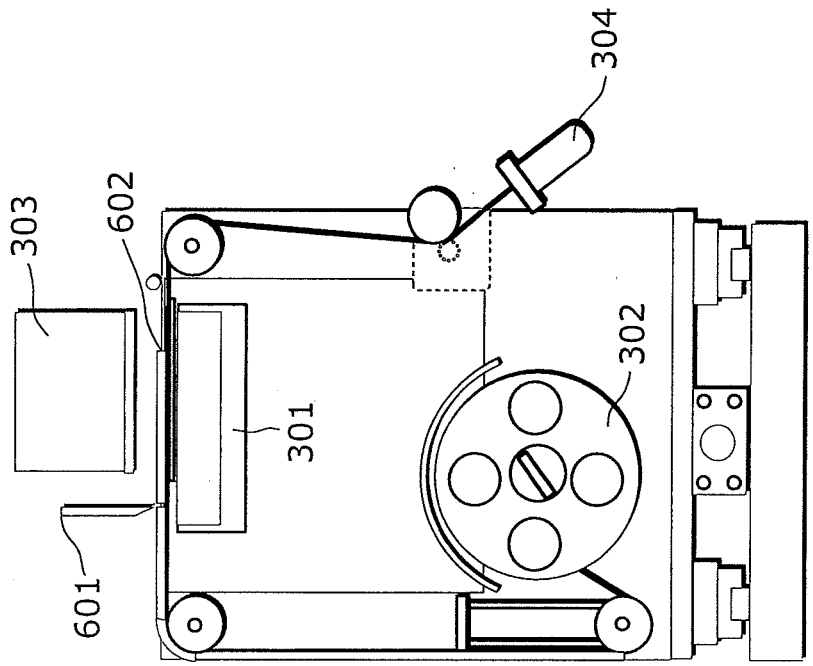
FIG. 6B illustrates an operation procedure of an ACF cutter included in the ACF attachment device according to the present invention.

Next, as shown in FIG. 6B, the ACF 602 cut by the ACF cutter 601 is fed into the ACF attachment unit 301.

Then, as shown in FIG. 7A, in the ACF attachment unit 301, the nozzle 303 suctioning the electronic component is lowered, and the ACF is pressure bonded to the edge portion with predetermined pressure.

Then, as shown in FIG. 7B, the nozzle 303 is raised by a predetermined amount, which causes the ACF attached to the terminal surface of the electronic component to be also raised. The peeling roller 701 shown in FIG. 7C is laterally driven between the ACF and the separator, thereby allowing the ACF to be appropriately peeled from the separator.

Note that, depending on the type of the ACF, the ACF is attached to the electronic component and then the nozzle 303 is raised to cause the ACF to be naturally peeled from the separator, and thus the peeling roller 701 in the present embodiment is not always necessary.

Figure 8:
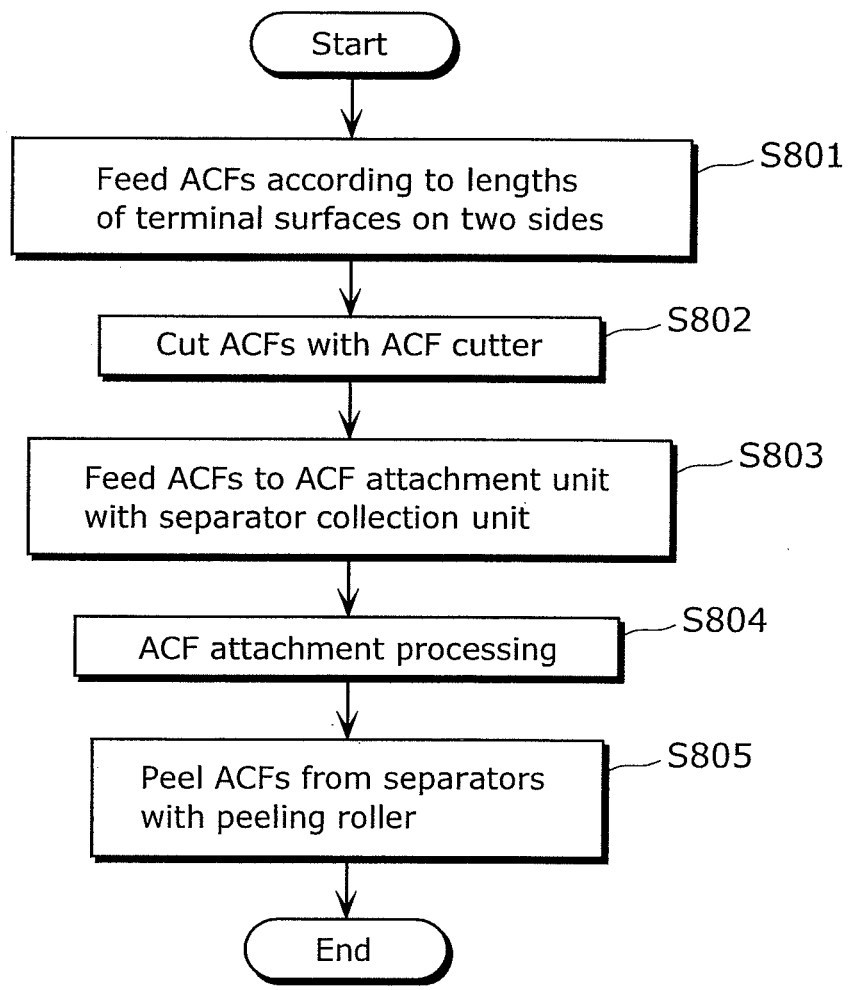
FIG. 8 is a flowchart showing an operation procedure of the ACF attachment device shown in FIGS. 6 and 7 according to the present invention.

FIG. 8 is a flowchart showing an operation procedure of the ACF attachment device shown in FIGS. 6 and 7 according to the present invention.

First, the separator collection unit 304 is driven to feed the ACF according to the lengths of the terminal surfaces on the two sides of the electronic component (S801).

Then, after the ACF is cut from upward by the ACF cutter 601 (S802), the feeding unit is driven to feed the ACF to an attachment position of the ACF attachment unit 301 (S803). Then, the nozzle 303 suctioning the electronic component from the back surface is lowered to attach the ACFs to the opposite terminal surfaces of the electronic component with predetermined pressure (S804), and then the nozzle 303 is raised. Then, the ACFs are peeled from the separators by the peeling roller 701 (S805), and the series of processings are repeatedly performed for each electronic component to be pressure bonded to the liquid crystal panel.

Figure 10:
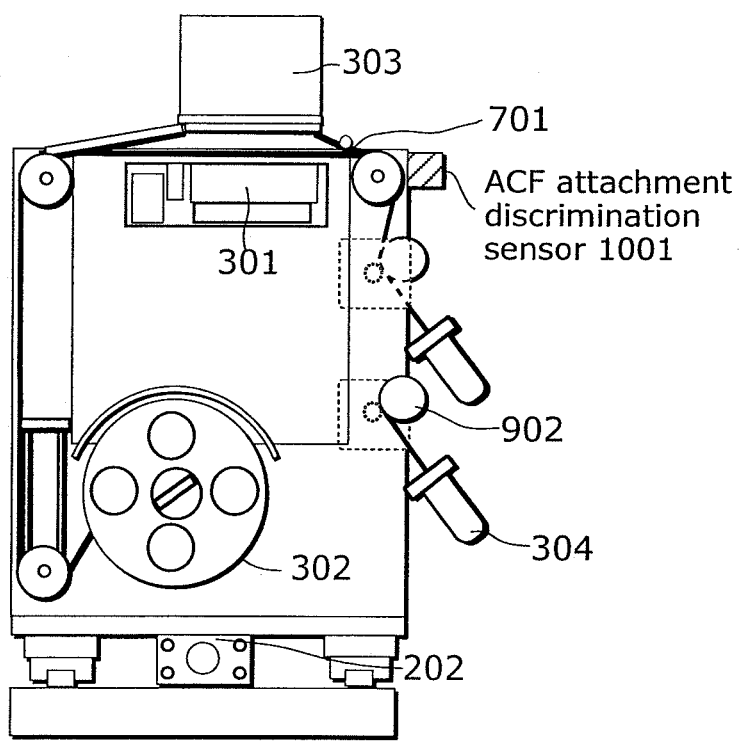
FIG. 10 is a front view of an example of the ACF attachment device including an ACF attachment discrimination sensor for checking whether an ACF is attached to an electronic component.

FIG. 10 shows an example of the ACF attachment device including an ACF attachment discrimination sensor 1001 for checking attachment of the ACF to the electronic component.

For example, the ACF attachment discrimination sensor 1001 is provided in a position immediately after the ACF attachment unit 301, and the separator after the attachment stage by the ACF attachment unit 301 is checked by the ACF attachment discrimination sensor 1001 to judge whether the ACF is reliably attached to the electronic component.

The ACF attachment discrimination sensor 1001 checks whether the ACF remains on the separator by checking, for example, the amount of reflected light. Also, the ACF attachment is checked immediately after the ACF attachment stage, thereby allowing a judgment processing to be performed without the influence on mounting tact time.

Whether the ACF is appropriately attached can be checked before the electronic component is temporarily or fully pressure bonded to the liquid crystal panel, thereby preventing production of defective liquid crystal panels.

As described above, in the preliminary press bonding device according to the present invention, the ACF attachment device is placed between the component supply unit and the preliminary press bonding unit. In the ACF attachment device, the ACFs can be simultaneously attached to the two sides on the board side and the panel side of the electronic component such as the TCP immediately before the preliminary press bonding stage, and thus attachment of the ACFs to the electronic component can be completed in one stage. Also, the ACF attachment stage provided in a conventional liquid crystal driver mounting device can be omitted, thereby reducing the size of the device and increasing mounting tact time.

In the ACF attachment device according to the present invention, the ACFs are individually attached to the edge portion of the electronic component, and thus as compared with collective attachment used in the conventional ACF attachment device, the amount of ACFs used can be reduced to reduce costs without reducing a production tact time.

Although only an exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The ACF attachment device according to the present invention can be used, for example, in the preliminary press bonding device used in the liquid crystal driver mounting stage of mounting the electronic component to the liquid crystal panel.

The invention claimed is:

1. An ACF attachment method, comprising:
supplying an electronic component from a component supply unit, the electronic component having a first terminal surface disposed on a first edge portion of the electronic component and a second terminal surface disposed on a second edge portion of the electronic component, the second edge portion being disposed on the same face of the electronic component as the first edge portion and on an opposite side of the electronic component from the first edge portion;
suctioning the electronic component;
simultaneously attaching a first ACF to the first terminal surface and a second ACF to the second terminal surface;
providing an ACF attachment device which includes two ACF attachment units for attaching the first ACF and the second ACF,
wherein the two ACF units are positioned according to a space between the first terminal surface and the second terminal surface of the electronic component, and
wherein said attaching the first and second ACFs is performed using the two ACF attachment units.

2. The method of claim 1, wherein said suctioning operation is performed using a nozzle, and
wherein the first and second ACFs are attached to the first and second terminal surfaces while the nozzle suctions and holds the electronic component.

3. The method of claim 1, wherein the first and second edge portions of the electronic component are disposed on opposite sides of the electronic component in a width direction of the electronic component.

4. The method of claim 3, wherein said suctioning operation is performed using a nozzle, and
wherein the first and second ACFs are attached to the first and second terminal surfaces while the nozzle suctions and holds the electronic component.

* * * * *